(12) United States Patent
Masham et al.

(10) Patent No.: US 7,919,962 B2
(45) Date of Patent: Apr. 5, 2011

(54) MAGNET SCANNING DEVICE THAT SCANS A CYLINDRICAL MAGNET ALONG A HELICAL PATH

(75) Inventors: Roger D. Masham, Ashwell Herts (GB); Peter M. Hughes, Lydney Glos. (GB)

(73) Assignee: Xerox Corporation, Norwalk, CT (US)

( * ) Notice: Subject to any disclaimer, the term of this patent is extended or adjusted under 35 U.S.C. 154(b) by 598 days.

(21) Appl. No.: 11/942,931

(22) Filed: Nov. 20, 2007

(65) Prior Publication Data

US 2009/0128135 A1   May 21, 2009

(51) Int. Cl.
*G01R 33/00* (2006.01)
*B05C 1/08* (2006.01)

(52) U.S. Cl. ............................................. 324/261; 492/9
(58) Field of Classification Search .................. 324/261, 324/205, 235, 238, 262; 492/9
See application file for complete search history.

(56) References Cited

U.S. PATENT DOCUMENTS

| | | | |
|---|---|---|---|
| 3,861,025 A * | 1/1975 | Sims ............................... 29/593 |
| 4,739,273 A * | 4/1988 | Petersen et al. ............... 324/242 |
| 4,806,971 A | 2/1989 | Masham |
| 5,327,083 A * | 7/1994 | Crytzer et al. ................. 324/239 |
| 6,092,032 A * | 7/2000 | Hirayama ...................... 702/115 |
| 6,125,255 A | 9/2000 | Litman et al. |
| 6,343,419 B1 | 2/2002 | Litman et al. |
| 6,422,984 B1 | 7/2002 | Masham et al. |
| 6,876,829 B2 | 4/2005 | Masham |
| 6,990,307 B2 * | 1/2006 | Dera ............................. 399/267 |
| 2004/0114970 A1 | 6/2004 | DeYoung et al. |
| 2008/0136408 A1* | 6/2008 | Andra et al. ................... 324/239 |

FOREIGN PATENT DOCUMENTS

CN    1542445 A   * 11/2004

OTHER PUBLICATIONS

English translation of CH1542445A, 28 pages, May 2010.*

* cited by examiner

*Primary Examiner* — Patrick J Assouad
*Assistant Examiner* — David M. Schindler
(74) *Attorney, Agent, or Firm* — Oliff & Berridge, PLC (57) ABSTRACT

A magnet scanning device uses a helical scanning technique to scan a cylindrical magnet along a helical path on a cylindrical surface that corresponds to the cylindrical magnet. Based on the magnetic field profile, the device may detect any unacceptable irregularities in the magnetic field and identify a location of the cylindrical magnet associated with the irregularity.

14 Claims, 9 Drawing Sheets

FIG. 3　TOP VIEW

FIG. 4

PLAN VIEW
FIG. 6

MAGNET SCANNING DEVICE THAT SCANS A CYLINDRICAL MAGNET ALONG A HELICAL PATH

BACKGROUND

Magnets have a wide variety of applications from xerographic processes to permanent magnet motors. In many of these applications, the magnetic field profiles of magnets arranged generally in a cylindrical shape (cylindrical magnets) are important. Thus, it is often desirable to measure and confirm the magnetic field profile of the cylindrical magnets.

SUMMARY

A magnet scanning device and magnet scanning technique are disclosed that scan a cylindrical magnet (a magnet generally having a cylindrical shape) along a helical path on a cylindrical surface that corresponds to the cylindrical magnet.

The scanning device may include an apparatus for holding the cylindrical magnet, a magnetic field sensor for measuring a magnetic field profile in one or more directions, and one or more motors that rotate and/or translate the cylindrical magnet relative to the magnetic field sensor to helically scan the cylindrical magnet. For example, a first motor may rotate the cylindrical magnet and a second motor may move the magnetic field sensor along an axial direction of the cylindrical magnet, while the magnetic field sensor measures a magnetic field profile along a helical path.

The device may include a first encoder that determines a rotational angle of the cylindrical magnet and a second encoder that determines an axial position of the magnetic field sensor relative to the cylindrical magnet. The encoders may provide a coordinate (rotational angle, axial position) for each measurement made by the magnetic field sensor. In this way, a map of the magnetic field profile of the cylindrical magnet may be obtained. Additionally, interpolation techniques may be used to obtain even higher resolution of the magnetic field profile so that features of the cylindrical magnet such as defect location and distribution, magnetic field linearity, etc., may be determined with great accuracy.

The device may also include a processor such as a microcomputer or a general purpose processor such as a personal computer (PC) or workstation, for example. The processor may collect magnetic field sensor output samples and construct a magnetic field profile including performing any desired interpolation processing. Based on the magnetic field profile, the processor may detect any unacceptable irregularities in the magnetic field and identify a location of the cylindrical magnet associated with the irregularity. This defect information may be used for subsequent correction by replacing offending portions of the cylindrical magnet, for example. If no unacceptable irregularity is detected, then the cylindrical magnet may be released for production of a product, for example.

EMBODIMENTS

Cylindrical magnets have multiple uses in a wide range of fields. For example, rotors of permanent magnet motors include a cylindrical magnet having magnets arranged with poles alternating (N-S-N-S . . . ) around a circumference of the rotor, each pole extending along the length of the rotor in the axial direction. In xerographic devices, cylindrical magnets may be used as a magnetic brush for placing toner particles on a photoreceptor. The magnetic brush introduces the toner particles to a latent image formed on the photoreceptor in a controlled manner in order to ensure that the toner particles adhere to the latent image in a desirable manner for high quality image production.

A magnetic brush may include a magnetic core having a cylindrical shape with a rotational axis extending through its length and a generally circular cross-section with a circumference. The magnetic core may be inserted into a non-magnetic cylindrical sleeve, such as an aluminum sleeve, for example. The magnetic core may have magnetic poles that alternate polarity around the circumference that extend the entire length of the magnetic core in an axial direction, for example.

As noted above, the magnetic fields generated by the magnetic core influence an amount of toner that is introduced to a latent image. Thus, unacceptable variations in the magnetic field of the magnetic core may produce less than desirable results, such as over-developed images with too much toner, or moth-eaten images with white spots where the image was not sufficiently developed. Therefore, it is often desirable to control the magnetic field profiles of the magnetic cores in order to ensure high quality image productions.

While magnets have many uses such as, but not limited to, magnet motors and xerographic devices, as discussed above, the example of cylindrical magnets for use as magnetic brushes in xerographic image developing systems will be used as an example in the following discussion. However, the discussion is generally related to scanning of magnetic fields, regardless of the size, shape, or application of the respective magnets.

Figure 1:
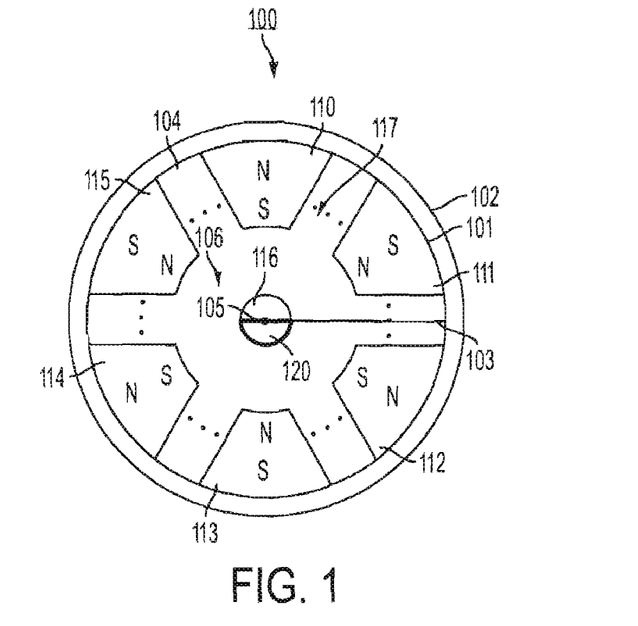
FIG. 1 shows a cross sectional view of an exemplary cylindrical magnet.
Figure 2:
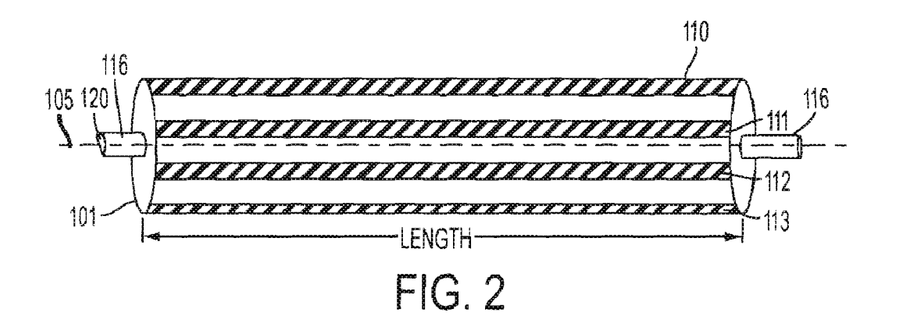
FIG. 2 shows a side view of an exemplary magnetic core.

FIG. 1 shows a cross-sectional view of an exemplary cylindrical magnet 100 that includes a magnetic core 101 and a sleeve 102 made of non-magnetic material such as aluminum. Magnetic core 101 includes a core 117, a shaft 116 that extends through a rotational axis of magnetic core 101, and magnets 110-115 disposed along a circumference of a generally circular cross-section of core 117 arranged in an alternating polarity configuration. Generally, radius 103 of the cross-section of magnetic core 101, extending from axis 105 to the cylindrical surface of magnetic core 1301, may be about 15 millimeters (mm) for a typical xerographic device. As shown in FIG. 2, magnets 110-115 of magnetic core 101 may extend along axis 105 and have a length of about 300 mm to about 1000 mm.

Core 117 may be formed of moldable material such as polyester, nylon, acrylic, extruded aluminum alloy, etc and may have a central portion 106 and rib portions 104, for example. Shaft 116 supports magnetic cylinder 100 and is disposed along axis 105 of core 117. Shaft 116 may include a D-flat portion 120 as shown in FIGS. 1 and 2, for example. Magnets 110-115 may be made of any magnetizable material such as iron, nickel, plastic impregnated with magnetic material (plastic magnets), ceramic magnets, etc, Plastic magnets may be molded into shapes that may be directly assembled into core 117 without further processing, for example.

Magnets 110-115 may be inserted into spaces formed by rib portions 104 as shown in FIG. 1 and held in place by adhesives such as glue or epoxy, or by mechanical retention methods, for example. Once magnets 110-115 and core 117 are assembled, magnetic core 101 may be machined to size the circumference for assembly into sleeve 102.

As discussed above, magnetic fields of magnets 110-115 in magnetic core 101 influence an amount of toner that is introduced to a latent image of a photoreceptor. To ensure even distribution of toner, the magnetic fields near the surface of magnetic core 101 should be relatively constant along the axial direction. Additionally, magnetic field characteristics in the circumferential direction of the magnetic core 101 may be important for proper toner application.

Unfortunately, due to manufacturing realities, magnets may have defects such as air holes, nicks, scrapes, foreign particles, etc. Depending on the material used, these defects may have a wide range of sizes, such as, for example, 0.2 mm to 5 mm. Further, rib portions 104 may have oblong or eccentric shapes, which may result in misplaced magnets 110-115 that lead to undesirable magnetic field profiles. Accordingly, it is often desirable to determine acceptability of magnetic field profiles of a magnetic core 101 before incorporation into products.

Figure 3:
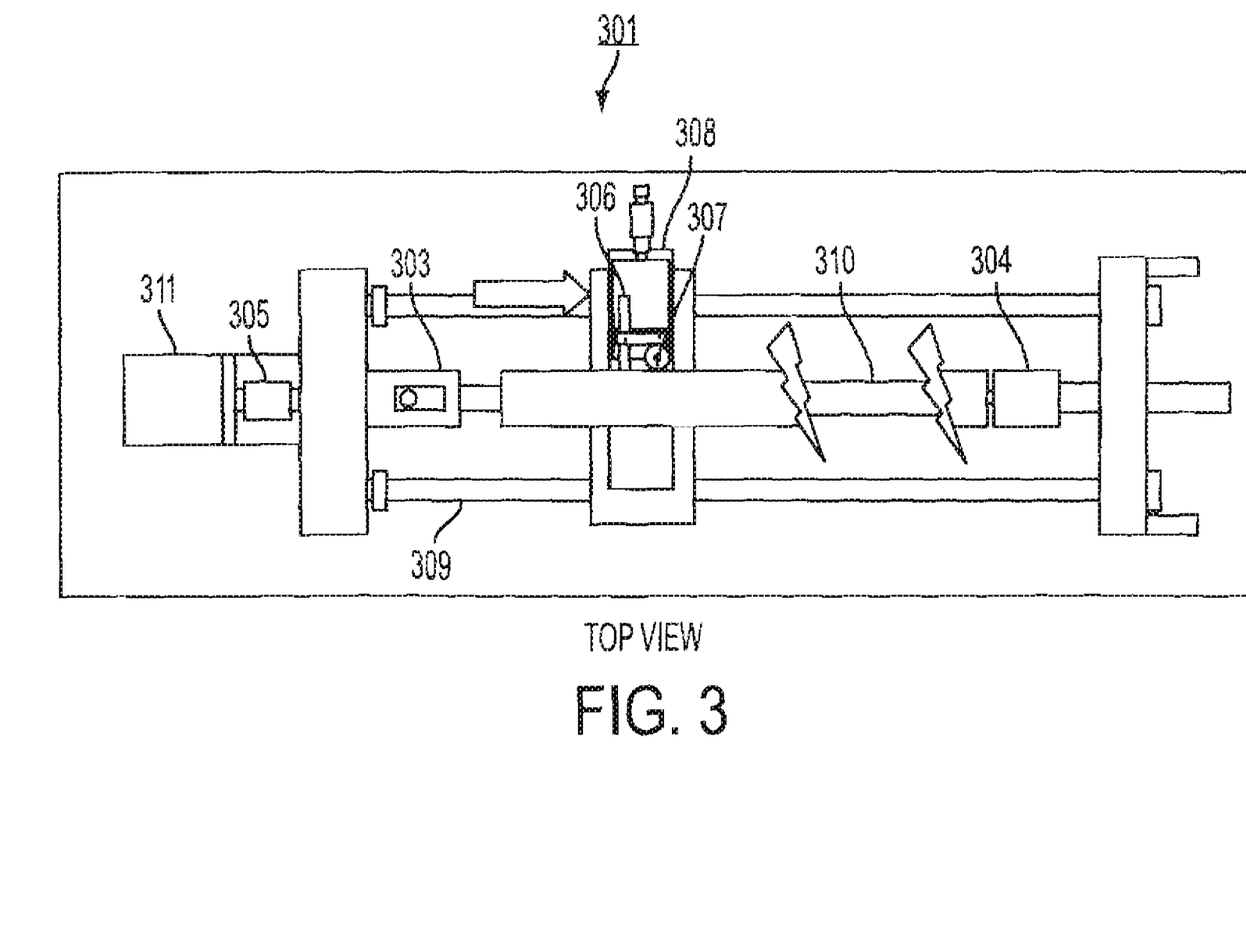
FIG. 3 shows an exemplary scanning fixture.

FIG. 3 shows a magnet scanning fixture 301 that may be used to scan magnetic core 101 when held by headstock 303 and tailstock 304, for example. As magnetic core 101 is rotated around its axis 105, radial and tangential magnetic field sensors 306 and 307, respectively, mounted on magnetic field sensor fixture 308, are moved in the axial direction to measure the magnetic field profile along a path over a cylindrical surface corresponding to magnetic core 101. Radial magnetic field sensor 306 may detect a magnetic field in a radial direction while tangential magnetic field sensor 307 may detect a magnetic field in a tangential direction that is perpendicular to the radial and axial directions.

Figure 4:
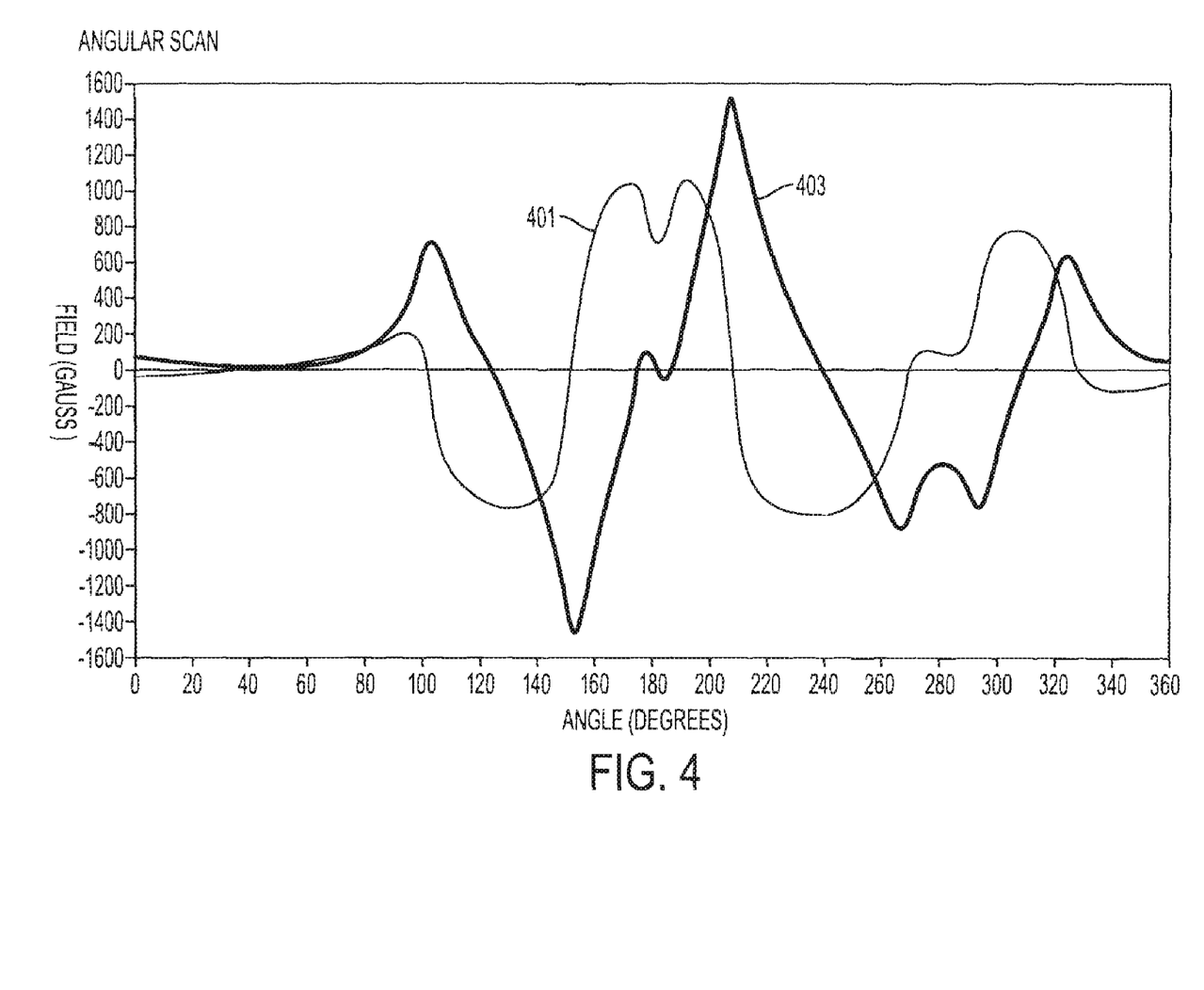
FIG. 4 shows an exemplary magnetic field profile in a circumferential direction for a cylindrical magnet.
Figure 5:
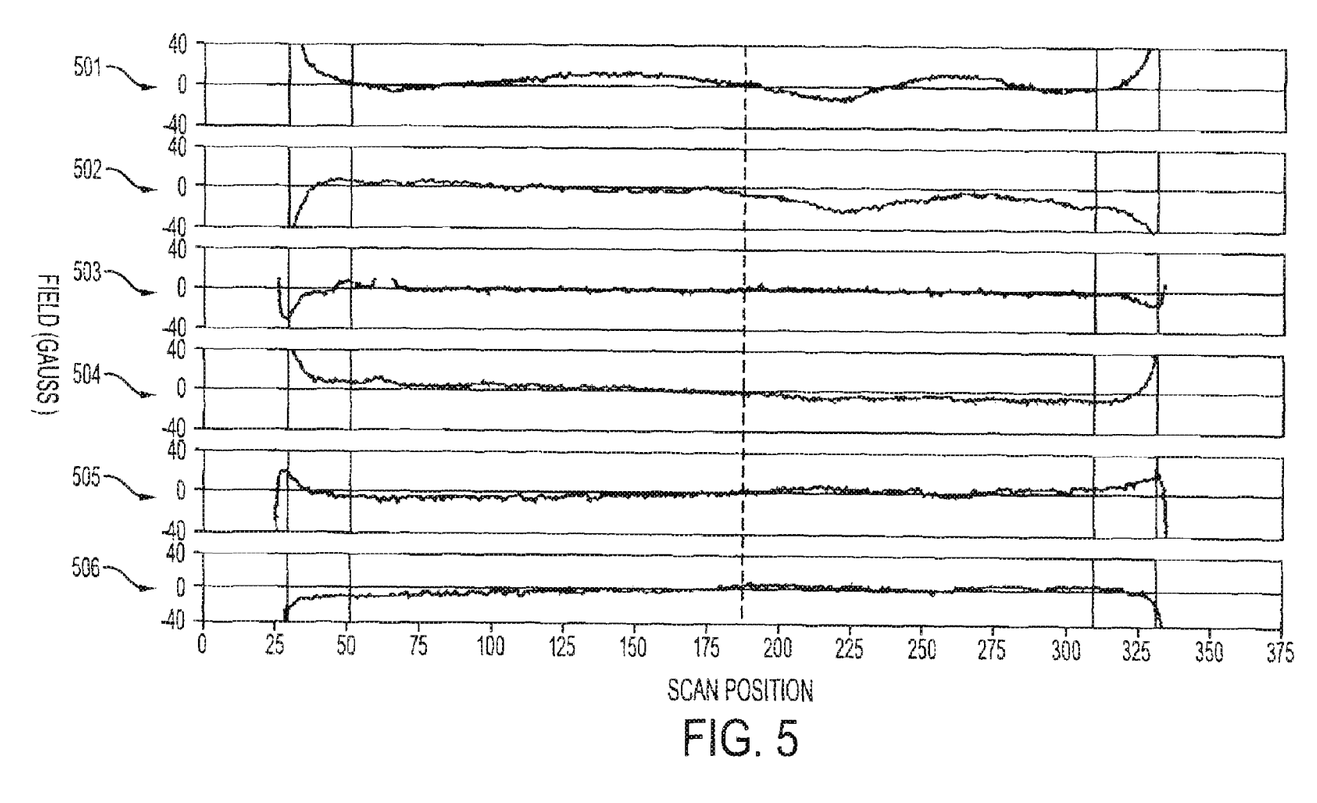
FIG. 5 shows an exemplary magnetic field profile in an axial direction for a cylindrical magnet.

FIG. 4 shows exemplary circumferential magnetic field profiles 401 and 403 for radial and tangential directions, respectively. Magnetic field profiles 401 and 403 show magnetic field intensities for a circular path obtained at a fixed axial location while magnetic core 101 is rotated 360° around axis 105. FIG. 5 shows exemplary magnetic field profiles 501-506 of magnetic core 101 along a linear path in the axial direction at different rotation angles. The vertical axes in FIG. 5 indicate a magnetic field intensity variation from an average, for example, and the horizontal axes indicate a scan position along the axial direction. These magnetic field profiles may be obtained by either holding magnetic field sensors 306 and 307 at a fixed position and rotating magnetic core 101, or fixing magnetic core 101 at a rotational position and moving magnetic field sensors 306 and 307 along the axial direction. Magnetic field profiles such as the ones shown in FIGS. 4 and 5 may be saved as a standard against which magnetic filed profiles of other magnetic cores 101 may be compared for acceptability.

While magnetic field profile measurements in the radial and tangential directions are shown, measurements in other directions, such as along the axial direction for the length of the magnetic core, for example, may also be taken, recorded, and/or compared to a standard to determine acceptability. Specifically, axial measurements may be useful in measuring end effects in the axial position. For example, as can be seen from FIG. 5, the magnetic field variation in measurements 501-506 is larger at either end of the magnetic core than it is toward the center. It may be desirable to measure these end effects along the axial direction in order to determine any extraordinary variations.

Figure 6:
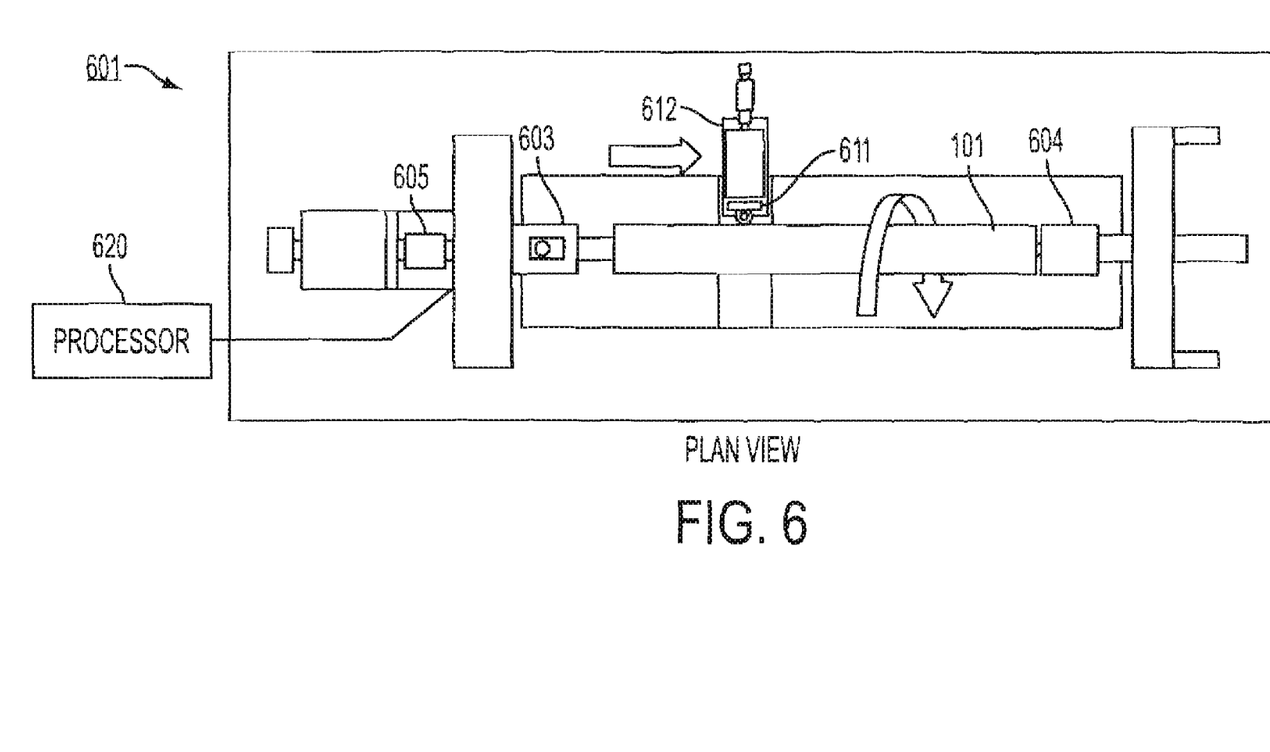
FIGS. 6 and 7 shows an exemplary helical scanning fixture.
Figure 7:
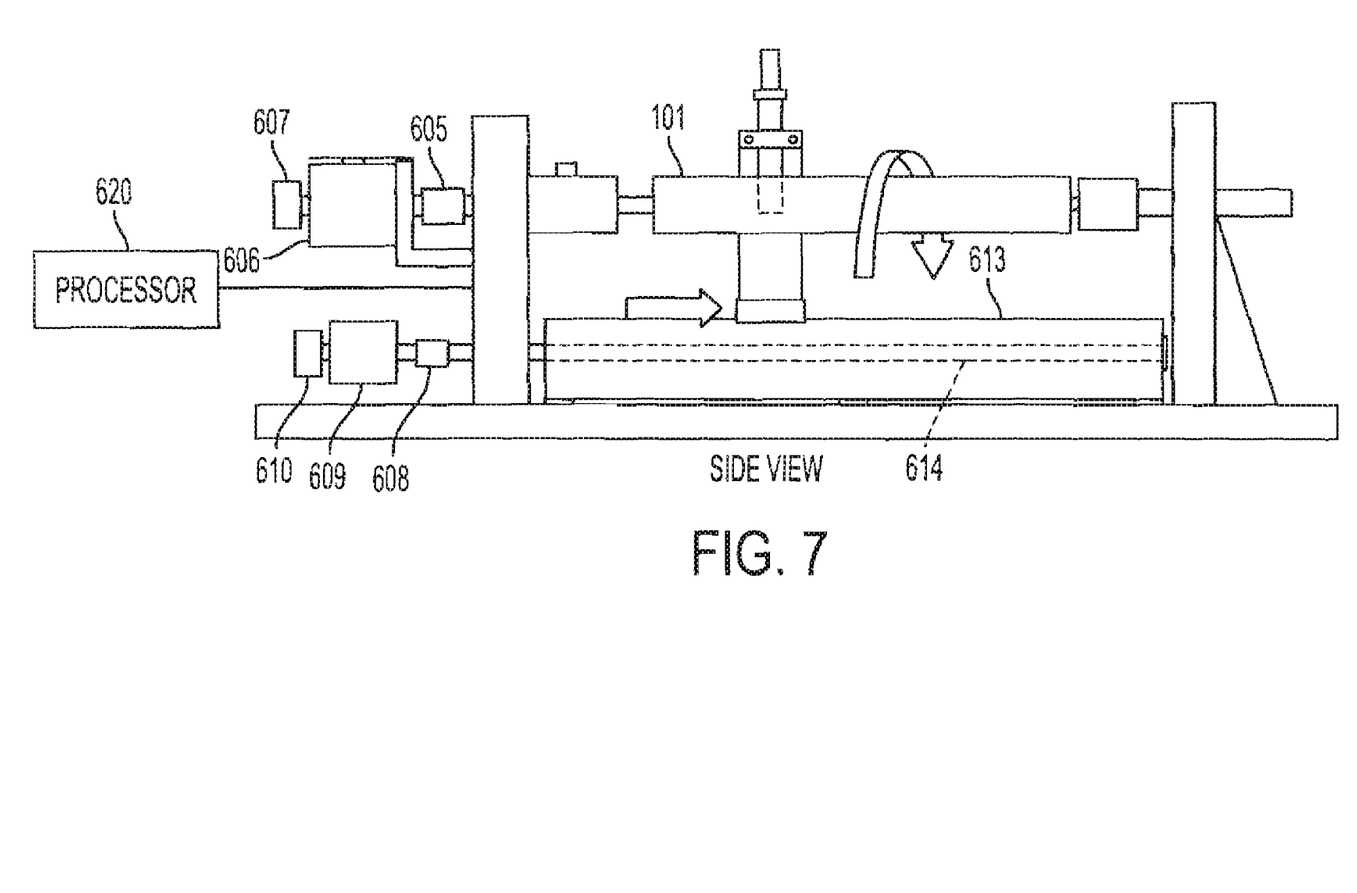

FIGS. 6 and 7 show an exemplary magnetic scanning fixture 601 in plan and front views. Magnetic Core 101 may be supported by headstock 603 and tailstock 604, and may be rotated by motor 606 via coupling 605. Magnetic field sensor 611 may be mounted on magnetic field sensor fixture 612, which may be moved axially along rails 613 by lead screw 614, when rotated by motor 609 via coupling 608, for example.

Encoders 607 and 610 may be rotary encoders, for example. Encoder 607 may measure an angle of rotation of magnetic core 101 and encoder 610 may measure an axial position of magnetic field sensor 611. The axial position may be determined by a starting axial position, a number of turns of lead screw 614 and its angular position. Encoders 607 and 610 may provide coordinates (angle, axial position) for measurements taken by magnetic field sensor 611 so that a magnetic field profile of the complete surface of magnetic 101 may be obtained.

Figure 8:
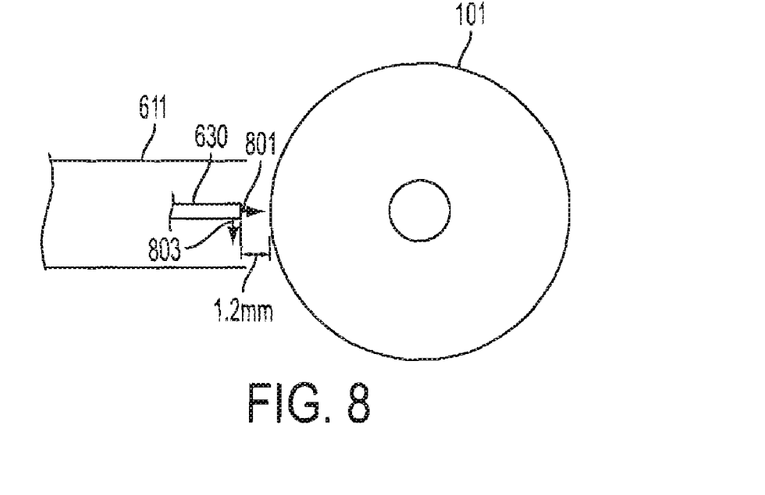
FIG. 8 shows an exemplary alignment of a magnetic field sensor.

Magnetic field sensor 611 may include one or more Hall effect sensors such as Hall effect sensor 630 shown in FIG. 8 for measuring magnetic fields in one or more directions. Hall effect sensor 630 may be selected to have desirable characteristics such as magnetic field sensitivity, magnetic field frequency, etc. For example, a magnetic field sensor from Senis Sensors model number C-H3A-2M_E3D (Senis sensor) having a maximum magnetic field frequency of 2.5 KHz may be used. Sensors having higher magnetic field frequency sensitivity permits higher sampling rates, and thus higher speeds by which a magnetic filed profile may be obtained.

For the following discussion, Hall effect sensor 630 is assumed to be capable of measuring the magnetic field at least along radial and tangential directions of magnetic core 101. However, any sensor may be chosen to measure the magnetic field along any other directions, such as the axial direction, for example. The Senis sensor is capable of measuring the magnetic field in three perpendicular directions (i.e. radial, tangential and axial), for example. However, this sensor may also be used to only measure the magnetic field in two of the directions, such as radial and tangential, as discussed above.

FIG. 8 shows Hall effect sensor 630 configured to measure magnetic fields in radial direction 801 and tangential direction 803. Hall effect sensor 630 may be disposed from about 1 mm to about 5 mm from the surface of magnetic core 101. For example, Hall effect sensor 630 is shown in FIG. 8 to be positioned about 1.2 mm from the surface of magnetic core 101. Thus, Hall effect sensor 630 may measure a magnetic field on a cylindrical surface that is spaced from a surface of magnetic core 101 between a range of about 1 mm to about 5 mm.

Processor 620 may be connected to magnetic field sensor 611, motors 606 and 609, and encoders 607 and 610 for control and data collection and processing, for example. Processor 620 may be a CPU such as a microprocessor, PC, etc. that receives measurements from magnetic field sensor 611 and encoders 607 and 610. During a scanning operation, processor 620 may receive outputs from encoders 607 and 610 with data from magnetic field sensor 611 so that each magnetic field measurement data may be stored corresponding to a position relative to the surface of magnetic core 101.

Figure 9:
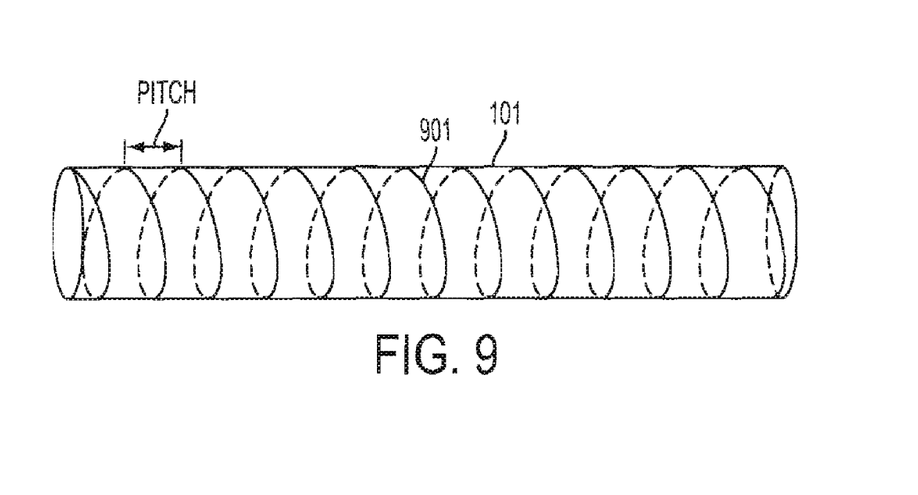
FIG. 9 shows an exemplary helical path.

Processor 620 may coordinate motors 606 and 609 to perform helical scanning along a helical path 901, as shown in FIG. 9. The helical path may begin at one end of magnetic core 101 and end at the opposite end. Data samples from magnetic field sensor 611 and coordinate information may be stored together or the data samples may be stored having an address that corresponds to the associated coordinate information. If stepper motors are used as motors 606 and 609 so that the exact relative position between magnetic field sensor 611 and magnetic core 101 are precisely known, then the location of the stored data samples can be unambiguously determined without explicit coordinate information as long as the scanning process start at a known point. Furthermore, if stepper motors are used, encoders 607 and 610 may not be used.

One or more known points may be indicated by physical notches in magnetic core 101, one or more alignment marks on the surface of magnetic core 101, a D-flat portion of a shaft attached to magnetic core 101 such as D-flat portion 120, for example, or other convenient methods. The physical notches may be used to align headstock 603 when mounting magnetic core 101, for example. The alignment marks may be detected by one or more photo detectors disposed at fixed positions to unambiguously specify, a starting position.

Helical scanning may use only an initial set-tip time for mounting magnetic core 101 and aligning magnetic field sensor 611. Helical scanning may be performed in about 2 minutes or less using the Senis sensor. Once a scanning operation is completed and a new magnetic core 101 is mounted, magnetic field sensor 611 may begin scanning starting at the position that the previous helix ended, so as to eliminate any time used to return magnetic field sensor 611 to a same fixed starting position. Additionally, the helical path may be left handed or right handed so that only the motor 609 operates in two rotational directions.

As shown in FIG. 9, a pitch of the helical path is a distance between adjacent portions of the helical path in the axial direction. Various pitches are obtained by controlling relative rotational speeds of motors 606 and 609. If a fixed pitch is desired, then a single motor may be used and headstock 603 and lead screw 614 may be mechanically coupled to rotate at a fixed ratio, for example. The pitch may be set based on parameters such as a measurement width of magnetic field sensor 611, measurement resolution, scanning time, etc. For example, if the measurement width of magnetic field sensor 611 is about 0.5 mm and a diameter of a smallest detectable defect is set to about 0.2 mm in diameter, a pitch of about 0.7 mm or less may be used. In general, the pitch minus the measurement width of the magnetic field sensor should be less than or equal to the diameter of the smallest detectable defect. However, this pitch may be increased if a magnetic field divergence is considered so that the pitch minus the measurement width of the magnetic field sensor may be less than or equal to twice the diameter of the smallest detectable defect.

If production time is of primary concern, magnetic core 101 is rotated at 330 rpm, and scanning time is desired to be less than 1 minute, then magnetic field sensor 611 may move at 5 mm per second for a 300 mm magnetic core and the pitch may be set to 1 mm or more to complete the scan in 1 minute. Magnetic core 101 may be rotated at higher speeds if greater resolution than can be afforded by the 1 mm pitch is desired.

At high rotational speeds, centrifugal forces may cause magnets 110-115 to deform outwardly and thus become closer to magnetic field sensor 611 and change the measured magnetic field profile from that in operational use. Rotational speeds of 800 rpm may be achieved for most magnetic cores used in xerographic devices. Thus, rotating magnetic cores 101 at 800 rpm may be possible without causing deformities in the shape of magnetic cores 101. If high rotational speeds are desired, magnetic cores 101 may be balanced before performing helical scanning. Counterbalances may be added to, or holes may be drilled in magnetic core 101 to balance magnetic core 101. However, scanning speeds for each type of magnetic cores 101 may be considered.

Figure 10:
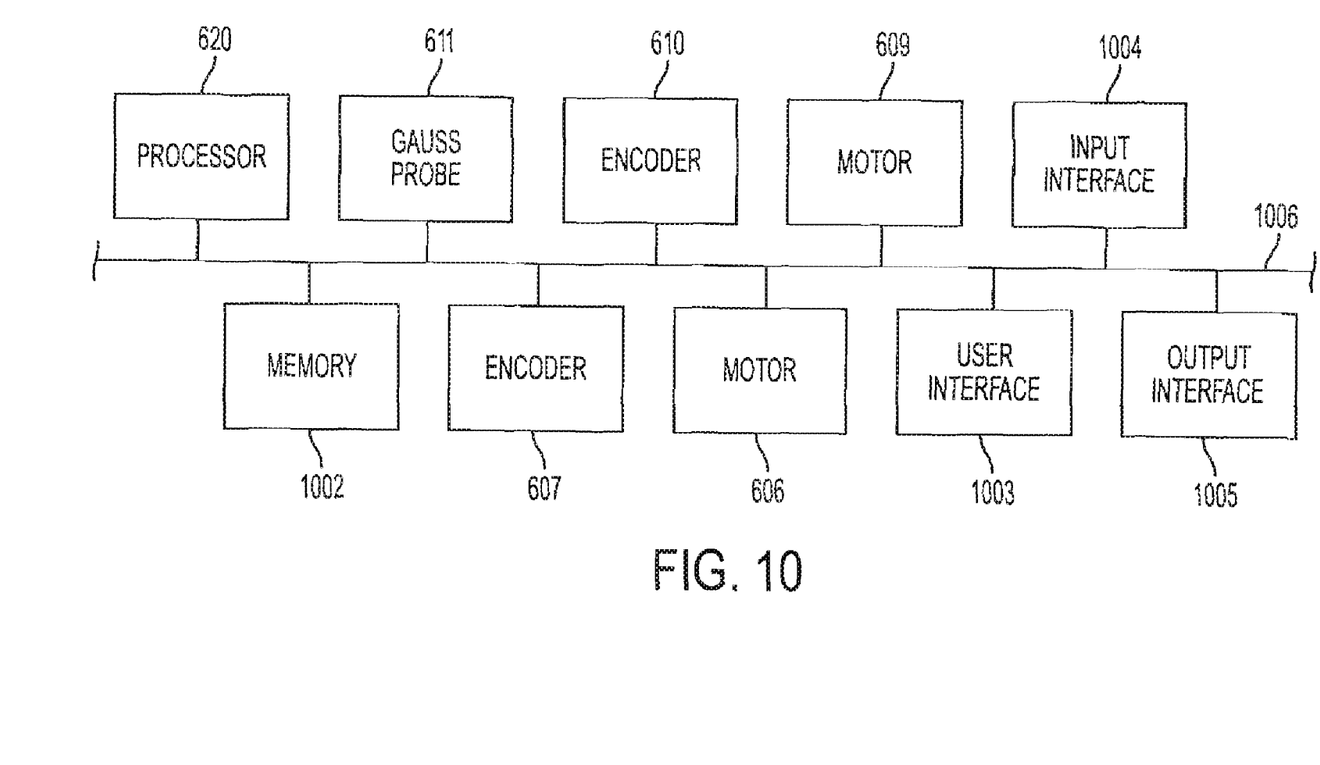
FIG. 10 shows a block diagram of an exemplary magnet testing device.

FIG. 10 shows an exemplary electrical block diagram of a magnet testing device 1000 that may include processor 620, memory 1002, magnetic field sensor 611, encoder 607, encoder 610, motor 606, motor 609, user interface 1003, input interface 1004 and output interface 1005. The above components may be electrically coupled together by bus 1006. While the testing device is illustrated using a bus architecture, any other type of convenient architecture may be implemented using any of a variety of technologies such as PLI, PAL, application specific integrated circuits (ASICs) or off the shelf components. Processor 620 and interfaces 1003-1005 may be implemented in hardware by a general purpose processor or a special purpose processor or may be implemented by software in one or more processors. Input and output interfaces 1004 and 1005, respectively, may be any type of interface such as network interfaces using wired, wireless, optical, etc., technologies, internal device interfaces, etc. These interfaces may implement standard protocols such as TCP/IP, USB, IEEE 1394, etc. Additionally, user interface 1003 may be a controller for a workstation or a personal computer (PC), for example, and may include a mouse, keyboard, voice recognition, or other input devices as well as a display such as LED, CRT, plasma, electrophoretic, LCD, etc display. Memory 1002 may be hard disk, RAM, ROM, flash memories, bubble memories, etc.

Information may be sent to or acquired by processor 620 for calibration of magnet testing device 1000. For example, a user at user interface 1003 may enter input information such as axial speed of magnetic field sensor 611, rotational speed of magnetic core 101, pitch of the helical path, frequency of measurement of magnetic field sensor 611, etc. The user may also enter initialization information such as a starting rotational angle and axial position, such as, 0 degrees of rotation from some point and 25 mm from one end of the cylinder, for example. Similarly, a user may enter a batch, serial or model number for magnetic core 101, and processor 620 may acquire the input information stored for each batch, serial or model number from memory 1002 or from an external memory or server on a network via input interface 1004. Further, processor 620 may receive calibration and initialization information as well as commands for operation via input interface 1004 from a production management device or program controlling multiple magnet testing devices and/or other manufacturing and assembly devices in a manufacturing environment, to thereby control production and testing of magnetic cores, either individually or by batch processing.

In accordance with the calibration and initialization information, processor 620 controls motors 606 and 609 to rotate magnetic core 101 and move magnetic field sensor 611, respectively, to generate the helical path, and receives data from magnetic field sensor 611, encoder 607 and encoder 610. For example, processor 620 may receive data points that include a radial magnetic field measurement, a tangential magnetic field measurement, a rotational position and an axial position. Each data point may be represented as a quadruplet such as (R, T, r, a), where "R" is a radial magnetic field measurement, "T" is a tangential magnetic field measurement, "r" is a rotational position and "a" is an axial position, for example. Also, the radial and tangential measurements may be divided into two triplets such as (R, r, a) and (T, r, a), for example.

Processor 620 may receive the data points for points along the helical path about the cylindrical surface corresponding to magnetic core 101, and may store them in memory 1002, or send them to an external processor or memory via output interface 1005. Processor 620 or an external processor may analyze the data points to perform quality control. For example, data points for the radial and tangential magnetic field measurements may be compared to and/or correlated with an ideal or desired magnetic field profile. If data points deviate from the ideal or desired profile beyond a predetermined threshold, which also may be set via user interface 1003 or input interface 1004, a message may be sent to user interface 1003 or to an external display via output interface 1004, indicating that magnetic core 101 may, be out of tolerance. Furthermore, since each data point includes a location of a magnetic field measurement with respect to the surface of magnetic core 101 (as determined by the "r" and "a" coordinates of the data point), the location of a defect may be determined.

The data points also may be represented graphically at user interface 1003 or at an external display via output interface 1005 using a graph of the magnetic field versus location on a cylindrical surface of magnetic core 101 for a certain axial position, rotational position, or range of either or both. For example, a three-dimensional (3-D) graph of the magnetic field along the cylindrical surface of magnetic core may be generated in x-y-z space, where the cylindrical surface may "unrolled" to form an x-y plane. The values of the magnetic field may be represented along the z-axis as a 3-D curved surface, or as different colors in the x-y plane. Also, a two-dimensional (2-D) graph may be generated in x-y space for the magnetic field profile around the circumference of magnetic core 101 for an axial position, or at varying axial positions for a rotational angle, similar to the graphs in FIGS. 4 and 5.

Such graphs may be generated and analyzed for certain regions of magnetic core 101 that are thought or known to be problematic. The graph may be compared to and/or correlated with an ideal graph, using curve fitting, for example. Also, the graph may be used to determine a cause of a problem, or to develop future magnetic cores with different desired magnetic field profiles. Further, since the data points received by processor 620 are discrete points, interpolation between the points, using linear interpolation, for example, may be used to create a continuous graph of a desired resolution of the magnetic field profile.

Processor 620 may also generate quality data based on the data points. For example, if it is determined that the magnetic field profile of magnetic core 101 is out of tolerance, a notification may be sent to an operator at user interface 1003, or to an external processor or other operator via output interface 1005. For example, the notification may include a "yes/no" quality control system for each magnetic core, or may indicate the locations) on magnetic core 101 where the magnetic field profile is out of tolerance. Further, the notification may include quality reports for each cylinder or each batch, such as X out of Y cores in this batch were out of tolerance. Such a report may be sent to a printer via output interface 1005, for example.

Figure 11:
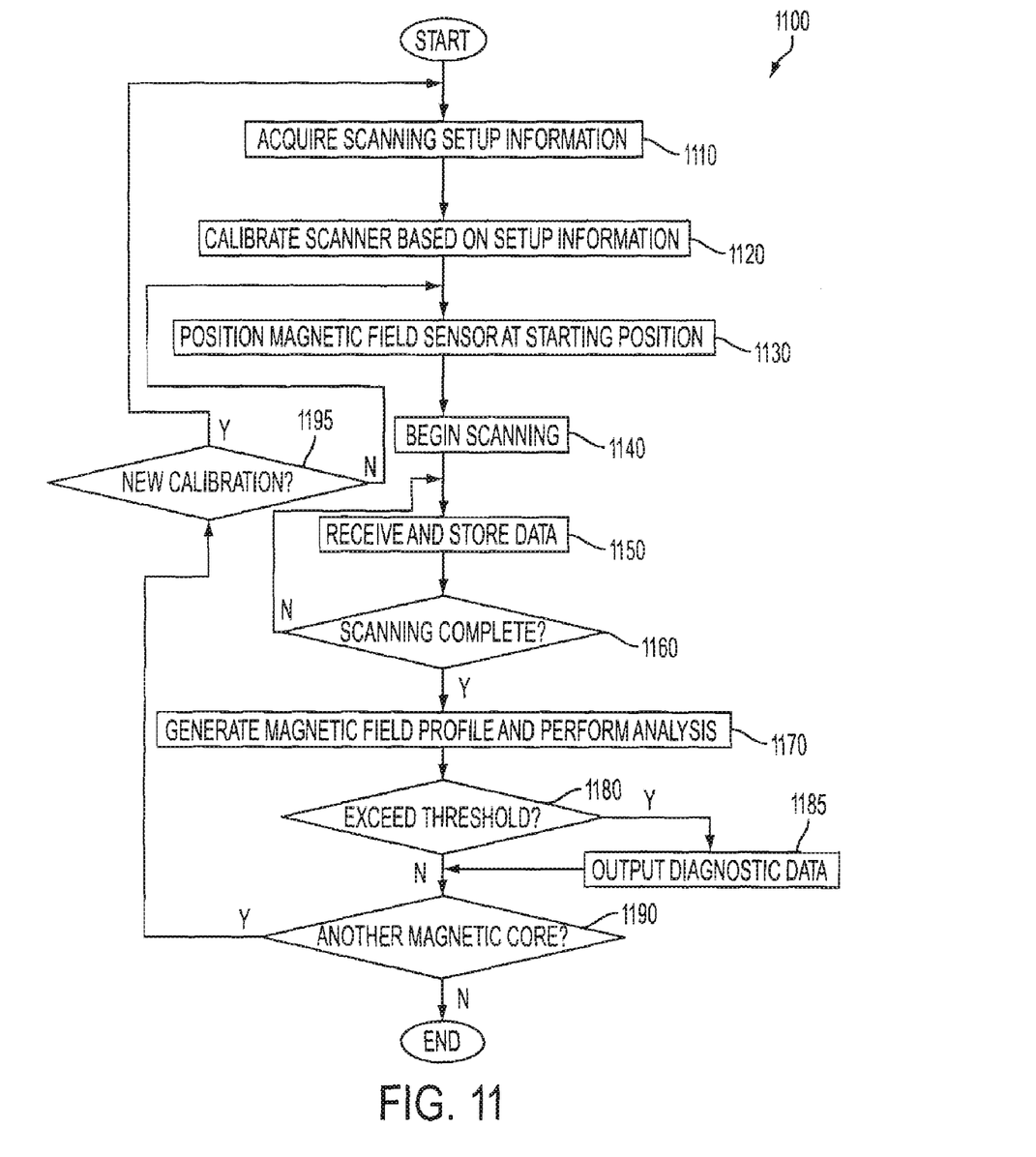
FIG. 11 shows a flow chart of an exemplary process for scanning a magnetic field profile.

FIG. 11 shows a flow chart 1100 of an exemplary process for scanning a magnetic field profile. In step 1110, the process acquires scanning setup information, such as axial speed of magnetic field sensor 611, rotational speed of magnetic core 101, pitch of the helical path, frequency of measurement of magnetic field sensor 611, a tolerance threshold for profile analysis, etc. As mentioned above, this information may be stored in memory, entered by a user, or determined by a batch or serial number of magnetic core 101, for example. If the setup information is determined by a batch number, the information may also include a batch size of magnetic cores being tested, so that the process information may be acquired once for an entire batch rather than for each magnetic core.

The process goes to step 11220. In step 1120, the process may calibrate the scanning equipment based on the setup information. For example processor 620 may send a command to magnetic field sensor 611 as well as encoders 607 and 610 to control the frequency of measurement of both the magnetic field and magnetic field sensor location with respect to the surface of magnetic core 101. The process goes to step 1130.

At step 1130, the process positions the magnetic sensor at a starting position. For example, processor 620 may command one or more motors, such as motors 606 and 609, for example, to position magnetic field sensor 611 in the starting position, and the process goes to step 1140. For example, the starting position may be identified by a notch in magnetic core 101 that aligns headstock 603 to a predetermined position, an optical marker that is detected by a photo detector, a D-flat portion etc. The process goes to step 1140.

At step 1140, the scanning process is started. For example, processor 620 may begin scanning by commanding motors 606 and 609 to rotate magnetic core 101 and move magnetic field sensor 611 parallel to axis 105 of magnetic core 101 and start a helical path. Magnetic field sensor 611 makes magnetic field measurements while encoders 607 and 610 gather corresponding location data. The process goes to step 1150. At step 1150, data is received and stored for each measurement, and the process goes to step 1160.

At step 1160, the processor determines if the scanning is complete. If not complete, the process returns to step 1150 and continues receiving and storing data. If the scanning is complete, the process goes to step 1170, where a magnetic field profile is generated based on the data and analysis is performed. As discussed above, processor 620 may generate the profile and perform computational or graphical analysis to determine whether or not the magnetic field profile matches a desired magnetic field profile within a given threshold. Additionally, the data points may be sent to an external processor for profile generation and analysis.

The process goes to step 1180, where the process determines whether the difference between the measured magnetic field profile and the desired magnetic field profile exceeds the threshold. If the difference exceeds the threshold, the process goes to step 1185 and outputs diagnostic data, such as to a monitor or a printer, and the process goes to step 1190. If at step 1180 the difference does not exceed the threshold, the process goes to step 1190.

At step 1190, if there is another magnetic core to be tested, the process goes to step 1195. At step 1195, if a new calibration is to be performed for the next magnetic core, the process returns to step 1110. For example, the scanner may be calibrated differently to adjust pitch, measurement frequency, magnetic field sensor starting position, etc. New calibration may occur when batches are changed, or if the magnetic field sensor starting position changes from one core to the next, for example. If, at step 1190, it is determined that there are not any more magnetic cores to be tested, the process ends.

It will be appreciated that various of the above-disclosed and other features and functions, or alternatives thereof, may be desirably combined into many other different systems or applications. Also, various presently unforeseen or unanticipated alternative, modifications, variations or improvements therein may be subsequently made by those skilled in the art, and are also intended to be encompassed by the following claims.

What is claimed is:

1. A magnetic field measuring apparatus, comprising:
a magnetic field sensor;
a helical path formed over a cylindrical surface of a magnetic core including magnets, the magnetic core having an axis, the magnetic field sensor being capable of measuring a magnetic field along the helical path;
a first motor that moves the magnetic field sensor relative to the cylindrical surface;
a second motor that rotates the magnetic core about the axis;
at least one rail disposed parallel to the axis, the magnetic field sensor being guided by the rail to move in an axial direction when actuated by the first motor, wherein the combination of the second motor rotating the magnetic core and the first motor axially moving the magnetic field sensor moves the magnetic field sensor such that the magnetic field sensor measures the magnetic field along the helical path relative to the cylindrical surface;
a first encoder that generates a first value, a rotational angle of the magnetic core being determined based on the first value;
a second encoder that generates a second value, an axial position of the magnetic field sensor being determined based on the second value; and
a processor that sets a coordinate corresponding to an output of the magnetic field sensor based on the first and second values.

2. The apparatus of claim 1, wherein at least one of the first and second motors is a stepper motor.

3. The apparatus of claim 1, further comprising:
a user interface for inputting a pitch of the helical path, the pitch of the helical path being set based on a detectable defect size.

4. The apparatus of claim 3, wherein the pitch of the helical path is set to a value between about 0.2 mm to about 5 mm.

5. The apparatus of claim 1, wherein the magnetic field sensor is capable of measuring at each point of the helical path the magnetic field in a tangential direction that is perpendicular to the axis and the magnetic field in a radial direction that is perpendicular to and toward the axis.

6. The apparatus of claim 5, wherein the magnetic field sensor is a Hall effect sensor that measures at each point of the helical path the magnetic field in an axial direction that is perpendicular to the tangential direction and the radial direction.

7. The apparatus of claim 4, further comprising:
a controller, the controller:
generating a magnetic field profile based on the magnetic field measured by the magnetic field sensor, and
determining acceptability of the magnetic field profile based on a threshold and a standard magnetic field profile.

8. A xerographic device comprising the magnetic field measuring apparatus of claim 1.

9. A method for obtaining a magnetic field profile with a magnetic field sensor, comprising:
forming a helical path over a cylindrical surface of a magnetic core including magnets, the magnetic core having an axis;
moving the magnetic field sensor longitudinally relative to the axis of the cylindrical surface using a first motor;
rotating the magnetic core about the axis using a second motor;
guiding the magnetic field sensor by a rail disposed parallel to the axis to move the magnetic field sensor in an axial direction using the first motor, wherein the combination of rotating the magnetic core with the second motor and axially moving the magnetic field sensor with the first motor moves the magnetic field sensor such that the magnetic field sensor measures the magnetic field along the helical path relative to the cylindrical surface;
generating a first value using a first encoder, the first encoder determining a rotational angle of the magnetic core based on the first value;
generating a second value using a second encoder, the second encoder determining an axial position of the magnetic field sensor based on the second value; and
setting a coordinate corresponding to an output of the magnetic field sensor based on the first and second values.

10. The method of claim 9, further comprising:
setting a pitch of the helical path based on a detectable defect size.

11. The method of claim 10, further comprising:
setting the pitch of the helical path to a value between about 0.2 mm to about 5 mm.

12. The method of claim 9, further comprising:
measuring at each point of the helical path the magnetic field in a tangential direction that is perpendicular to the axis and the magnetic field in a radial direction that is perpendicular to and toward the axis.

13. The method of claim 12, further comprising:
measuring at each point of the helical path the magnetic field in an axial direction that is perpendicular to the tangential direction and the radial direction, wherein the magnetic field sensor is a Hall effect sensor.

14. The method of claim 11, further comprising:
generating a magnetic field profile based on the magnetic field measured by the magnetic field sensor, and
determining acceptability of the magnetic field profile based on a threshold and a standard magnetic field profile.

* * * * *